(12) United States Patent
Wright

(10) Patent No.: US 9,590,669 B2
(45) Date of Patent: Mar. 7, 2017

(54) SINGLE VARACTOR STACK WITH LOW SECOND-HARMONIC GENERATION

(71) Applicant: TriQuint Semiconductor, Inc., Hillsboro, OR (US)

(72) Inventor: Peter V. Wright, Portland, OR (US)

(73) Assignee: Qorvo US, Inc., Greensboro, NC (US)

(*) Notice: Subject to any disclaimer, the term of this patent is extended or adjusted under 35 U.S.C. 154(b) by 0 days.

(21) Appl. No.: 15/005,235

(22) Filed: Jan. 25, 2016

(65) Prior Publication Data

US 2016/0329918 A1 Nov. 10, 2016

Related U.S. Application Data

(60) Provisional application No. 62/158,613, filed on May 8, 2015.

(51) Int. Cl.
*H04B 1/04* (2006.01)
*H01L 27/08* (2006.01)
*H01L 49/02* (2006.01)

(52) U.S. Cl.
CPC ....... *H04B 1/0475* (2013.01); *H01L 27/0808* (2013.01); *H01L 28/20* (2013.01)

(58) Field of Classification Search
CPC .................................................... H04B 1/0475
USPC ........................................................ 455/114.1
See application file for complete search history.

(56) References Cited

U.S. PATENT DOCUMENTS

| 5,055,889 A | 10/1991 | Beall |
|---|---|---|
| 7,323,763 B2 | 1/2008 | Suzuki et al. |
| 2004/0155719 A1 | 8/2004 | Suzuki et al. |
| 2005/0156194 A1 | 7/2005 | Ohbu et al. |
| 2007/0132065 A1 | 6/2007 | Lee et al. |
| 2008/0191260 A1 | 8/2008 | De Vreede et al. |
| 2009/0090951 A1 | 4/2009 | Chang et al. |
| 2009/0134960 A1* | 5/2009 | Larson .................... H01L 29/93 334/78 |
| 2009/0195958 A1* | 8/2009 | Vavelidis ................. H01G 7/06 361/281 |
| 2011/0140240 A1 | 6/2011 | Trivedi |

(Continued)

OTHER PUBLICATIONS

Author Unknown,"The Nuts and Bolts of Tuning Varactors," Digi-Key Corporation, Sep. 3, 2009, 15 pages.

(Continued)

*Primary Examiner* — Sanh Phu

(74) *Attorney, Agent, or Firm* — Withrow & Terranova, P.L.L.C.

(57) ABSTRACT

Embodiments include semiconductor devices related to compound varactor circuits. Specifically, a semiconductor device may be constructed of a modified anti-series string of varactor pairs, wherein one varactor in a varactor pair has an effective area larger than the other varactor. Varactor pairs in the anti-series string are arranged such that adjacent varactors coupling varactor pairs have equal effective areas. In some embodiments, the anti-series string may have four varactors (two varactor pairs.) In other embodiments, the anti-series string may have eight varactors (four varactor pairs) or twelve varactors (six varactor pairs). The compound varactor using the modified anti-series string of varactor pairs may be advantageous in reducing second harmonics related to parasitic capacitances in anti-series varactor applications.

20 Claims, 5 Drawing Sheets

(56) References Cited

U.S. PATENT DOCUMENTS

2014/0225225 A1    8/2014   Chung
2014/0273323 A1    9/2014   Kim
2015/0325573 A1    11/2015  Wright et al.

OTHER PUBLICATIONS

Huang, Cong et al., "A GaAs Junction Varactor With a Continuously Tunable Range of 9 : 1 and an $OIP_3$ of 57 dBm," IEEE Electron Device Letters, vol. 31, No. 2, Feb. 2010, pp. 108-110.
Kumar, Tribhuwan, "Varactor theory," SlideShare.net, Published on Dec. 21, 2013, slide 14, http://www.slideshare.net/tribhuwankumar73/varactor-theory, 2 pages.
Poole, Ian, "Varactor Abrupt & Hyperabrupt Diodes," Radio-Electronics.com, Date Accessed: Feb. 9, 2016, 5 pages, http://www.radio-electronics.com/info/data/semicond/varactor-varicap-diodes/hyperabrupt.php.
Restriction Requirement for U.S. Appl. No. 14/273,316, mailed Feb. 2, 2015, 8 pages.
Non-Final Office Action for U.S. Appl. No. 14/273,316, mailed Apr. 20, 2015, 14 pages.
Final Office Action for U.S. Appl. No. 14/279,316, mailed Nov. 27, 2015, 18 pages.
Non-Final Office Action for U.S. Appl. No. 14/485,532, mailed Nov. 9, 2015, 17 pages.
Notice of Allowance for U.S. Appl. No. 14/485,532, mailed May 25, 2016, 10 pages.
Non-Final Office Action for U.S. Appl. No. 14/273,316, mailed Sep. 2, 2016, 14 pages.

\* cited by examiner

SINGLE VARACTOR STACK WITH LOW SECOND-HARMONIC GENERATION

RELATED APPLICATIONS

This application claims the benefit of U.S. provisional patent application No. 62/158,613, filed May 8, 2015, the disclosure of which is incorporated herein by reference in its entirety.

FIELD OF THE DISCLOSURE

Embodiments of the present disclosure relate generally to the field of circuits, and more particularly to varactors.

BACKGROUND

A varactor is an electronic component with a capacitance that changes in response to an applied bias voltage. A varactor may be a diode under reverse bias that exhibits a capacitance that varies inversely with the applied voltage. As such, a varactor may be used for tuning electrical circuits. Varactors may be prone to self-modulation distortion resulting from applied radio frequency (RF) voltages. To reduce this nonlinearity a compound varactor may be formed having a number of individual varactors coupled in series to divide the RF voltage across each individual varactor.

SUMMARY

The present disclosure relates to varactors, and in particular to compound varactors. In certain embodiments a compound varactor may be formed as a semiconductor device having a substrate. The semiconductor device may include a first port having a cathode interface and a second port having a cathode interface. An anti-series string of varactors may be electrically coupled between the first port and the second port.

The anti-series string may include a first varactor, a second varactor having an anode electrically coupled to an anode of the first varactor, a third varactor having a cathode electrically coupled to a cathode of the second varactor, and a fourth varactor having an anode electrically coupled to an anode of the third varactor wherein the first and fourth varactors each have a first effective area and the second and third varactors each have a second effective area which is different than the first effective area. The effective area is defined as the area of a varactor layer in an epitaxial stack. In some embodiments, the first effective area is between 45% and 75% of the second effective area. In other embodiments, the first effective area is between 50% and 60% of the second effective area.

In other embodiments, the semiconductor device may have a first resistor electrically coupled between a third port and the anodes of the first and second varactors, and a second resistor electrically coupled between the third port and the anodes of the third and fourth varactors. A third resistor may electrically couple between a fourth port and the cathodes of the second and third varactors.

In another embodiment, the first anti-series string of varactors may be formed on a substrate, wherein each varactor of the first anti-series string of varactors is an epitaxial stack having an upper contact layer, a varactor layer, and a lower contact layer.

In other embodiments, the anti-series string may include a fifth varactor having a cathode electrically coupled to the cathode of the fourth varactor, a sixth varactor having an anode electrically coupled to an anode of the fifth varactor, a seventh varactor having a cathode electrically coupled to a cathode of the sixth varactor, and an eighth varactor having an anode electrically coupled to an anode of the seventh varactor wherein the fifth and eighth varactors each have the first effective area and the sixth and seventh varactors each have the second effective area.

In other embodiments, the semiconductor device may include a first port having an anode interface and a second port having an anode interface. An anti-series string of varactors may be electrically coupled between the first port and the second port.

The anti-series string may include a first varactor, a second varactor having a cathode electrically coupled to a cathode of the first varactor, a third varactor having an anode electrically coupled to an anode of the second varactor, and a fourth varactor having a cathode electrically coupled to a cathode of the third varactor wherein the first and fourth varactors each have a first effective area and the second and third varactors each have a second effective area which is different than the first effective area. In some embodiments the first effective area is between 45% and 75% of the second effective area. In other embodiments, the first effective area is between 50% and 60% of the second effective area.

In one embodiment, the first port is an input port, the second port is an output port, the third port is a v− bias port, and the fourth port is a v+ bias port.

In select non-limiting embodiments, the compound varactor may be incorporated in an impedance tuning circuit or an antenna tuning circuit for a radio front end (RFE) to reduce second order harmonic generation. In other embodiments, the modified compound varactor may be integrated with a voltage controlled oscillator, an electronically tuned filter, or an electronically controlled switch.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawings incorporated in and forming a part of this Specification illustrate several aspects of the disclosure, and together with the description serve to explain the principles of the disclosure.

DETAILED DESCRIPTION

Figure 1:
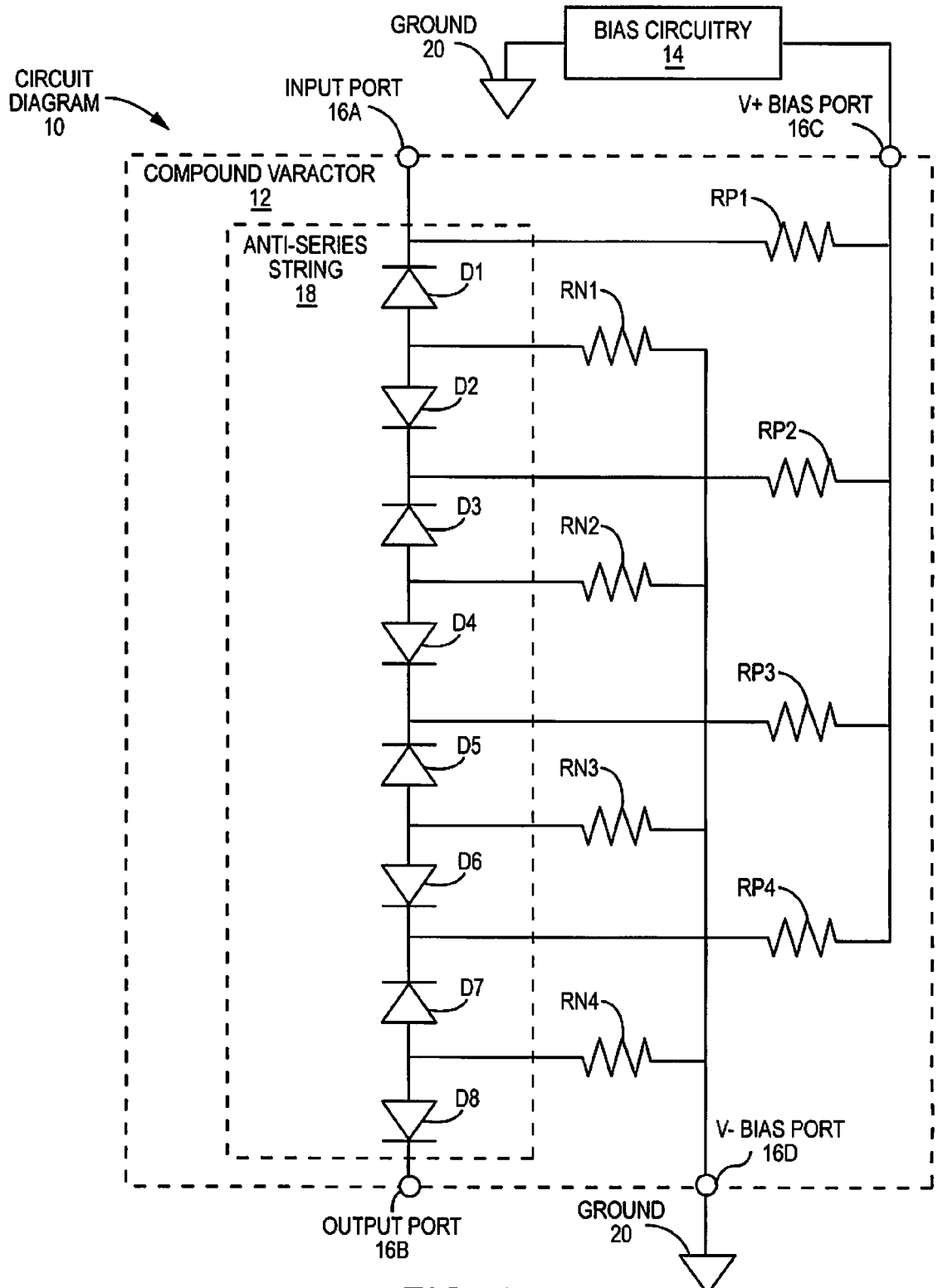
FIG. 1 illustrates a compound varactor in a circuit having an example anti-series string, in accordance with various embodiments.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element, or intervening elements may also be present. In contrast, when an element is referred to as being "directly over" or "extending directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the accompanying Figures. It will be understood that these terms and those discussed above are intended to encompass different orientations of the device in addition to the orientation depicted in the accompanying Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Related art here and in FIG. 1 discloses a circuit diagram 10 having a compound varactor 12 and bias circuitry 14. The compound varactor 12 may be a semi-conductor device and may have an input port 16A, an output port 16B, a v+ bias port 16C, and a v− bias port 16D. The input port 16A may have a cathode interface and the output port 16B may have a cathode interface. An example anti-series string 18 of varactors D1-D8 may be coupled between the input port 16A and the output port 16B. In an anti-series string, adjacent varactors may be coupled as cathode-to-cathode or anode-to-anode. As such, cathode of varactor D1 may be coupled with the input port 16A and coupled with the v+ bias port 16C via resistor RP1. Anodes of varactors D1 and D2 may be coupled together and coupled with v− bias port 16D via resistor RN1. Cathodes of varactors D2 and D3 may be coupled together and coupled with v+ bias port 16C via resistor RP2. Anodes of varactors D3 and D4 may be coupled together and coupled with v− bias port 16D via resistor RN2. Cathodes of varactors D4 and D5 may be coupled together and coupled with v+ bias port 16C via resistor RP3. Anodes of varactors D5 and D6 may be coupled together and coupled with v− bias port 16D via resistor RN3. Cathodes of varactors D6 and D7 may be coupled together and coupled with v+ bias port 16C via resistor RP4. Anodes of varactors D7 and D8 may be coupled together and coupled with v− bias port 16D via resistor RN4. Cathode of varactor D8 may be coupled with output port 16B. Varactors D1-D8 may be formed as individual epitaxial stacks on a substrate. Each epitaxial stack may be equal in size and doping profile, wherein each of the varactors D1-D8 have approximately equal capacitance-voltage (C-V) tuning characteristics.

Resisters RP1-RP4 may provide a bias voltage connection between each of the cathodes of varactors D1-D7 and the v+ bias port 16C. Resistors RN1-RN4 may provide bias connections between each of the anodes of the varactors D1-D8 and the v− bias port 16D. In some embodiments, the resistors RP1-RP4 and RN1-RN4 may be equal in resistance value (ohms or Ω). In other embodiments, certain resistors of resistors RP1-RP4 and RN1-RN4, such as outer resistor RP1, may be greater than the other resistors RP2-RP4 and RN1-RN4. In some embodiments resistor RP1 may be approximately 60 kΩ and resistors RP2-RP4 and RN1-RP4 may be approximately 30 kΩ. In other embodiments, RP1 may be between approximately 20 kΩ and approximately 60 kΩ while resistors RP2-RP4 and RN1-RP4 may be between approximately 10 kΩ and approximately 30 kΩ. In some embodiments, inductors may also be used in place of, or in combination with, the resistors RP1-RP4 and RN1-RN4. In other embodiments, a resistor (not shown) may be positioned between the output port 16B and the v+ bias port 16C.

Bias circuitry 14 may be coupled between the v+ bias port 16C and ground 20, and ground 20 may be coupled with v− bias port 16D to provide a reverse bias voltage to each of the varactors D1-D8. The bias circuitry 14 may set the effective capacitance of the example anti-series string 18. By increasing the bias voltage between the v+ bias port 16C and the v− bias port 16D, the effective capacitance of the example anti-series string 18 may be reduced. By decreasing the bias voltage between the v+ bias port 16C and the v− bias port 16D, the effective capacitance of the example anti-series string 18 may be increased.

In some embodiments, a radio frequency (RF) signal may propagate between the input port 16A and the output port 16B. In an ideal anti-series arrangement, each varactor D1-D8 may have negligible parasitic capacitance to other circuitry and/or ground 20. Varactors D1 and D2 may reduce self-modulation caused by propagation of the RF signal from the input port 16A to the output port 16B. As the RF signal increases, reverse bias voltage on D1 increases, and reverse bias voltage on D2 decreases. As such, as the capacitance of D1 decreases, the capacitance of D2 increases. By providing additional varactors D3-D8 in the example anti-series string 18, RF signal is reduced across each varactor D1-D8 of the example anti-series string 18 further reducing self-modulation.

However, in actual anti-series arrangements each varactor D1-D8 may have non-negligible parasitic capacitance to other circuitry and/or ground 20. In some embodiments, certain layers of each of the epitaxial stacks of the varactor D1-D8 may have an effective area over the substrate. This effective area may be proportional to the parasitic capacitance, wherein as the effective area is made larger the parasitic capacitance is larger. For example, the parasitic capacitance to ground 20 may be approximately 0.002 pico-Farads (pF) for each varactor D1-D8 having a capacitance between approximately 6 pF and 20 pF when reversed biased from approximately 18 volts to approximately 2 volts. In other embodiments, the parasitic capacitance may be between approximately 0.001 pF and 0.005 pF. As an RF signal such as a 900 Mega-Hertz (MHz) sine wave propagates from the input port 16A to the output port 16B, second harmonic signal may be generated from self-modulation. For example, a +35 decibel-milliwatts (dBm) sine wave may generate a second harmonic of approximately −54 dBm. In other embodiments, the second harmonic may be between approximately −50 dBm and approximately −60 dBm. This second harmonic signal may be unacceptable for unfiltered varactor applications such as directly coupled impedance matching of an antenna to a radio front end (or RFE) circuit. For example, the second harmonic from a transmitted signal of the RFE may violate the required frequency spectrum mask for the transmitted signal.

Figure 2:
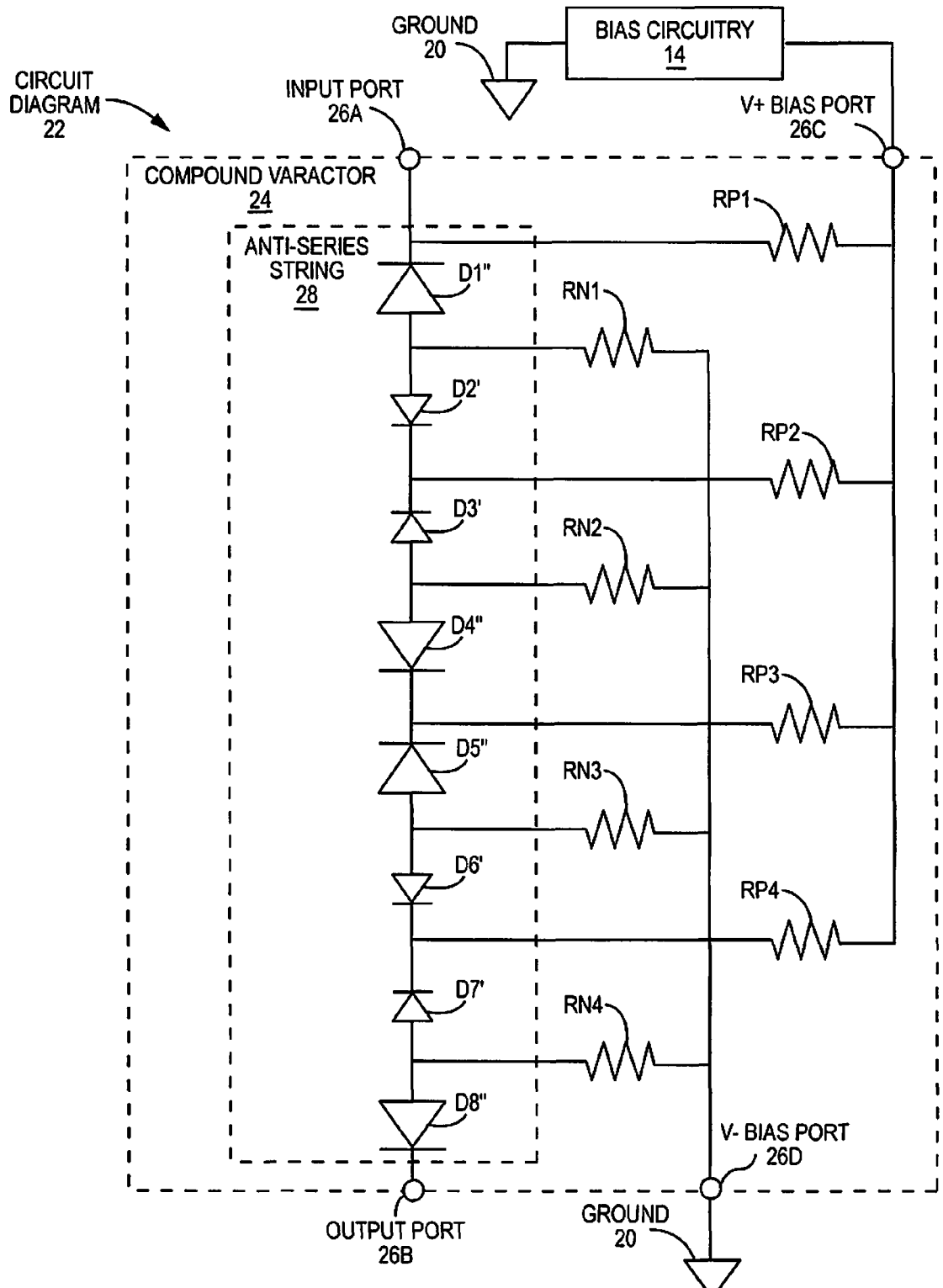
FIG. 2 illustrates a compound varactor in a circuit having a modified anti-series string, in accordance with various embodiments.

FIG. 2 illustrates a circuit diagram 22 having a compound varactor 24 and bias circuitry 14. The compound varactor 24 may be a semi-conductor device and may have an input port 26A, an output port 26B, a v+ bias port 26C, and a v− bias port 26D. The input port 26A may have a cathode interface and the output port 26B have a cathode interface. Compound varactor 24 replaces the compound varactor 12 shown in FIG. 1. The compound varactor 24 has a modified anti-series string 28 including varactors D1" through D8". Modified anti-series string 28 replaces the anti-series string 18 of compound varactor 12 shown in FIG. 1. Cathode of varactor D1" may be coupled with the input port 26A and coupled with the v+ bias port 26C via resistor RP1. Anodes of varactors D1" and D2' may be coupled together and coupled with v− bias port 26D via resistor RN1. Cathodes of varactors D2' and D3' may be coupled together and coupled with v+ bias port 26C via resistor RP2. Anodes of varactors D3' and D4" may be coupled together and coupled with v− bias port 26D via resistor RN2. Cathodes of varactors D4" and D5" may be coupled together and coupled with v+ bias port 26C via resistor RP3. Anodes of varactors D5" and D6' may be coupled together and coupled with v− bias port 26D via resistor RN3. Cathodes of varactors D6' and D7' may be coupled together and coupled with v+ bias port 26C via resistor RP4. Anodes of varactors D7' and D8" may be coupled together and coupled with v− bias port 26D via resistor RN4. Cathode of varactor D8" may be coupled with output port 26B. Varactors D1", D4", D5", and D8" may each have a first effective area and each have a first parasitic capacitance to other circuitry and/or ground 20. Varactors D2', D3', D6', and D7' may each have a second effective area that is smaller than the first effective area and each have a second parasitic capacitance that is smaller than the first parasitic capacitance. In a preferred embodiment, the second effective area may be 55% of the first effective area. In other embodiments, the second effective area may be between 50% and 60% of the first effective area, while in other embodiments, the second effective area may be between 45% and 75% of the first effective area.

Resisters RP1-RP4 may provide parallel bias voltage connections between each of the cathodes of varactors D1" through D8" of the modified anti-series string 28 and the v+ bias port 26C. Resistors RN1-RN4 may provide parallel bias connections between each of the anodes of varactors D1" through D8" and the v− bias port 26D. In some embodiments, a resistor (not shown) may be positioned between the output port 26B and the v+ bias port 26C.

Bias circuitry 14 may be coupled between the v+ bias port 26C and ground 20, and ground 20 may be coupled with v− bias port 26D to provide a reverse bias voltage across each of the varactors D1" through D8". The bias circuitry 14 may adjust the effective capacitance of the modified anti-series string 28.

As the RF signal described in FIG. 1 propagates from the input port 26A to the output port 26B, a second harmonic signal from self-modulation may be reduced from the second harmonic signal of the compound varactor circuit 12. In some embodiments, the second harmonic signal may be reduced by approximately 20 decibels (dB). This reduced level of second harmonic signal level generation may be acceptable for use of the compound varactor 24 in antenna matching and other unfiltered varactor applications.

The compound varactor 24 as compared with compound varactor 12 may have negligible change in the following varactor parameters:
  input third order intercept point (IIP3),
  output third order intercept point (OIP3), and
  quality factor (Q).

The total effective areas of modified anti-series string 28 have a less than 10% increase over the total effective areas of example anti-series string 18. In a non-limiting example for the compound varactor 12, the example anti-series string 18 may provide 1 unit of capacitance for a given bias voltage. Each varactor D1-D8 may have 8 units of effective area and may each provide 8 units of capacitance. The total effective area of the example anti-series string 18 may be 64 units. For the modified anti-series string 28 to provide 1 unit of capacitance for a given bias voltage, the effective area of each varactor D1", D4", D5", and D8" may have 11.3 units of effective area and may each provide 11.3 units of capacitance, while each varactor D2', D3', D6', and D7' may have 6.2 units of effective area and may each provide 6.2 units of capacitance. The total effective area of anti-series string 28 may be approximately 70 units. For this example the total increase in effective area of the modified anti-series string 28 is less than 10%.

Figure 3:
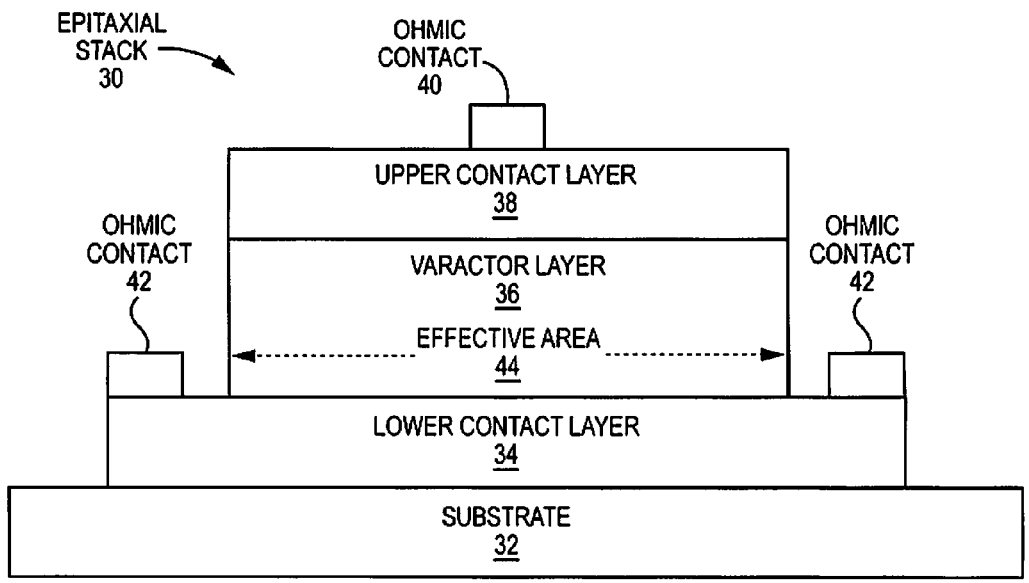
FIG. 3 illustrates a varactor formed in an epitaxial stack, in accordance with various embodiments.

FIG. 3 illustrates an epitaxial stack 30 forming a single varactor such as varactor D1", D2', D3', D4", D5", D6', D7', or D8", as shown in FIG. 2. In embodiments, the epitaxial stack 30 may comprise a plurality of layers formed on a substrate 32. The substrate 32 may be constructed of a semiconductor material that is relatively inert with respect to the epitaxial stack 30. The substrate 32 may be an undoped or a lightly doped semiconductor material having a relatively high resistivity as compared with the other layers.

A lower contact layer 34 may be positioned over the substrate 32. A varactor layer 36 may be positioned over the lower contact layer 34. An upper contact layer 38 may be position over the varactor layer 36. An ohmic contact 40 may be positioned over the upper contact layer 38. An ohmic contact 42 may be positioned over the lower contact layer 34. In some embodiments, the lower contact layer 34 may be a heavily doped P+ anode layer, while the upper contact layer 38 may be a heavily doped N+ cathode layer. In this embodiment, ohmic contact 40 may be a cathode contact and ohmic contact 42 may be an anode contact. In other embodiments, the lower contact layer 34 may be a heavily doped N+ cathode layer, while the upper contact layer 38 may be a heavily doped P+ anode layer. In this embodiment, ohmic contact 40 may be an anode contact and ohmic contact 42 may be a cathode contact.

The varactor layer 36 may be a lightly doped N− cathode layer and may be created with an abrupt, hyper abrupt, or linear doping profile. The area of the varactor layer 36 is the effective area 44 for parasitic capacitance effects as described in FIG. 2.

In some embodiments, portions of the modified compound varactor 24 may be configured as shown in FIG. 3 of U.S. Pat. No. 9,484,471, entitled "COMPOUND VARACTOR", which is hereby incorporated by reference in its entirety. Materials and manufacture processes for compound varactor 24 may be equivalent to compound varactor 12.

Figure 4:
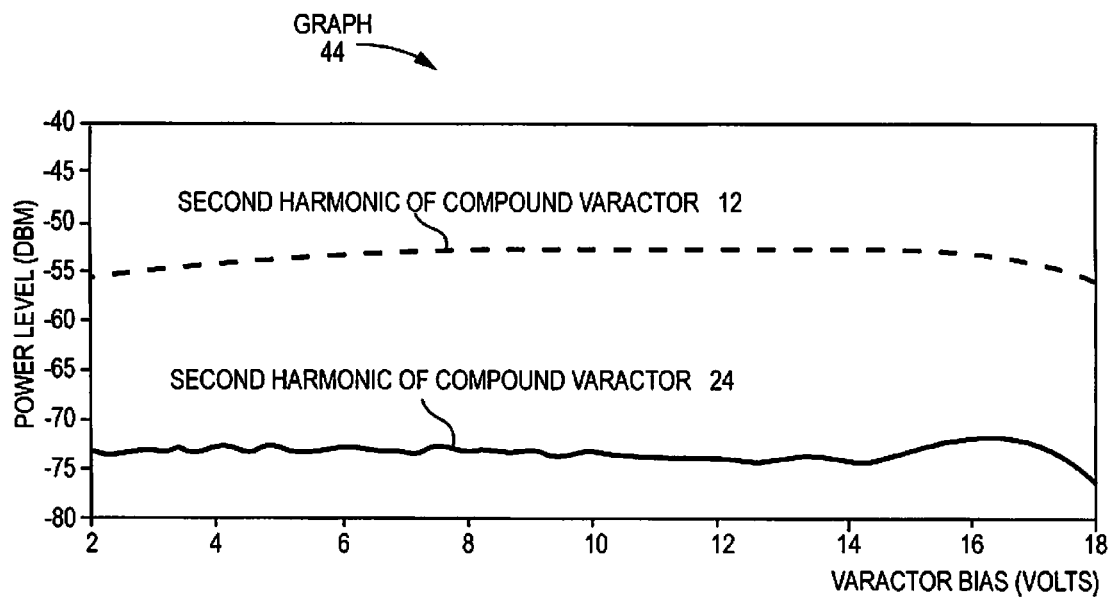
FIG. 4 illustrates a graph of second harmonic generation, in accordance with various embodiments.

FIG. 4 illustrates a graph 44 of second harmonic signal generation for compound varactors 12 and 24. Power level (dBm) of the second harmonic is represented on the vertical axis and varactor bias (volts) is represented on the horizontal axis. The dashed line plots the second harmonic of compound varactor 12 at output port 16B using the circuit diagram 10 of FIG. 1. Bias circuitry 14 is varied between 2 and 18 volts. A +35 decibel-milliwatts (dBm) sine wave at 900 MHz is coupled to input port 16A. The second harmonic is shown to vary between approximately −52 dBm and approximately −56 dBm. The solid line plots the second harmonic of compound varactor 24 at output port 26B using the circuit diagram 22 of FIG. 2. Bias circuitry 14 is varied between 2 and 18 volts. A +35 decibel-milliwatts (dBm) sine wave at 900 MHz is coupled to input port 26A. The second harmonic is shown to vary between approximately −72 dBm and approximately −77 dBm.

Figure 5:
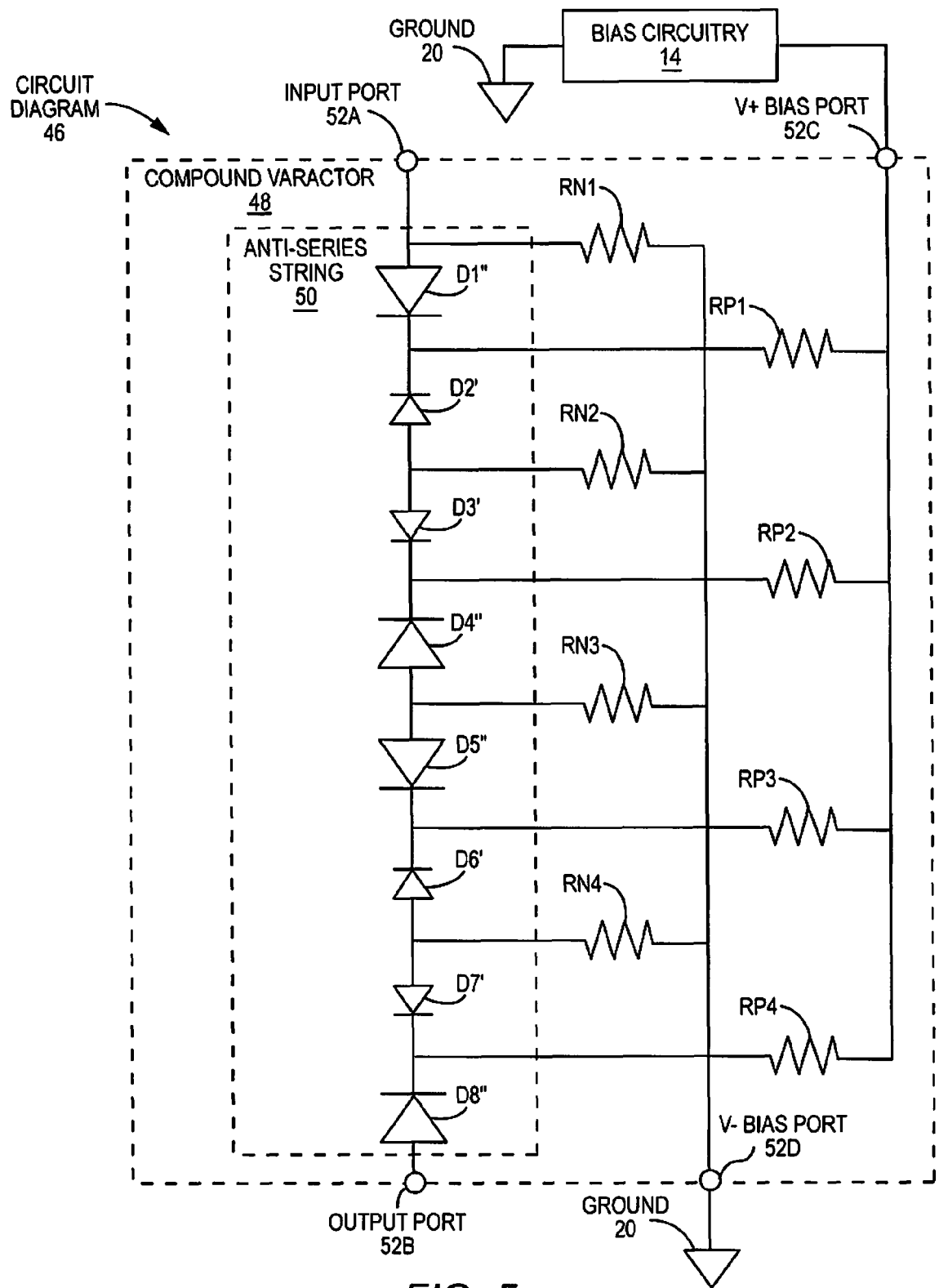
FIG. 5 illustrates an alternate embodiment of a compound varactor in a circuit having a modified anti-series string, in accordance with various embodiments.

FIG. 5 illustrates a circuit diagram 46 having a compound varactor 48 with modified anti-series string 50 and bias circuitry 14. Modified anti-series string 50 is an alternate embodiment of modified anti-series string 28 wherein cathodes are coupled to input port 52A and output port 52B. Compound varactor 48 also includes a v+ bias port 52C and a v− bias port 52D. The modified anti-series string 50 comprises varactors D1" through D8" and replaces the anti-series string 28 of compound varactor 24. Anode of varactor D1" may be coupled with the input port 52A and coupled with the v− bias port 52D via resistor RN1. Cathodes of varactors D1" and D2' may be coupled together and coupled with v+ bias port 52C via resistor RP1. Anodes of varactors D2' and D3' may be coupled together and coupled with v− bias port 52D via resistor RN2. Cathodes of varactors D3' and D4" may be coupled together and coupled with v+ bias port 52C via resistor RP2. Anodes of varactors D4" and D5" may be coupled together and coupled with v− bias port 52D via resistor RN3. Cathodes of varactors D5" and D6' may be coupled together and coupled with v+ bias port 52C via resistor RP3. Anodes of varactors D6' and D7' may be coupled together and coupled with v− bias port 52D via resistor RN4. Cathodes of varactors D7' and D8" may be coupled together and coupled with v+ bias port 52C via resistor RP4. Anode of varactor D8" may be coupled with output port 52B. Varactors D1", D4", D5", and D8" may each have the first effective area and each have the first parasitic capacitance to other circuitry and/or ground 20. Varactors D2', D3', D6', and D7' may each have the second effective area that is smaller than the first effective area and each have the second parasitic capacitance that is smaller than first parasitic capacitance. In a preferred embodiment, the second effective area may be 55% of the first effective area. In other embodiments, the second effective area may be between 50% and 60% of the first effective area, while in other embodiments, the second effective area may be between 45% and 75% of the first effective area Resisters RP1-RP4 may provide parallel bias voltage connections between each of the cathodes of varactors D1" through D8" of the modified anti-series string 50 and the v+ bias port 52C. Resistors RN1-RN4 may provide parallel bias connections between each of the anodes of varactors D1" through D7' and the v− bias port 52D. In some embodiments, a resistor (not shown) may be positioned between the output port 52B and the v− bias port 52D.

In some embodiments, the modified anti-series string 28 and 50 may have only four varactors. In other embodiments the modified anti-series string 28 and 50 may have twelve varactors.

Compound varactors 24 and 48 may be incorporated into a variety of devices and/or systems.

Figure 6:
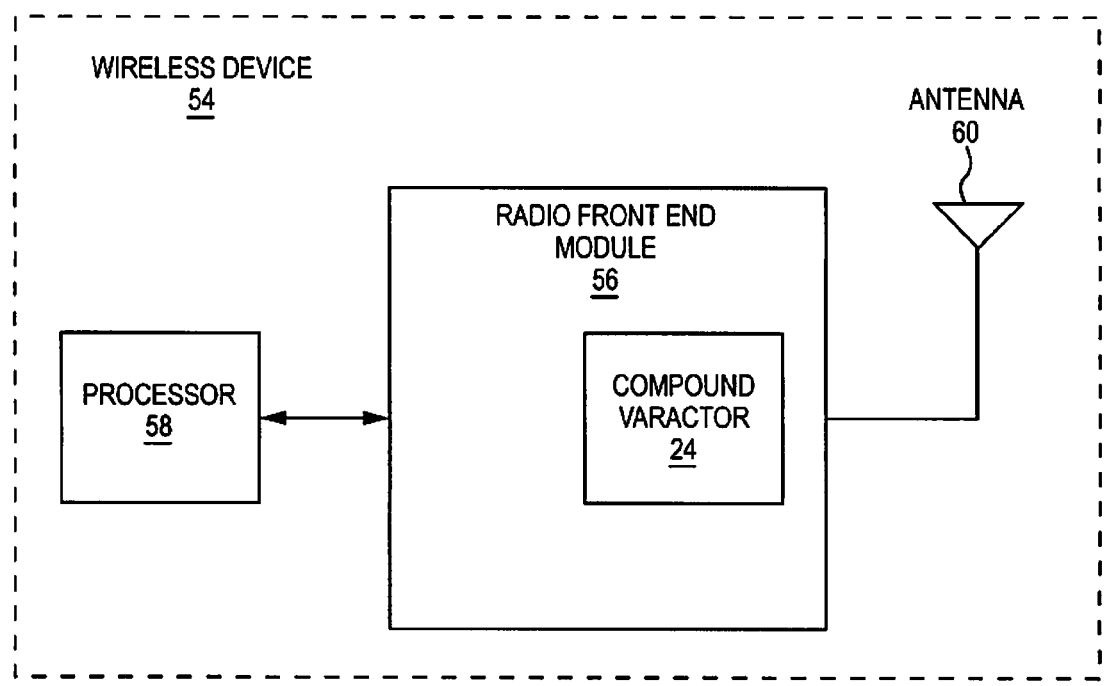
FIG. 6 illustrates a wireless device having the compound varactor, in accordance with various embodiments.

FIG. 6 illustrates a wireless device 54 having a radio front end (RFE) module 56 coupled with a processor 58 and an antenna 60. Compound varactor 24 may be incorporated within or coupled with the RFE module 56 and may be used to provide impedance matching of the antenna 60 with other circuitry of the RFE module 56. Such circuitry may be a transmission line, a filter, a transmit power amplifier (PA), or a receive low noise amplifier (LNA). In other embodiments of the RFE module 56, the modified compound varactor 24 may be configured to control the frequency of a voltage controlled oscillator (VCO), control the frequency and/or phase response of a filter, or be incorporated within an electronically controlled switch. In other embodiments, compound varactor 48 may be incorporated within or coupled with the RFE module 56.

Those skilled in the art will recognize improvements and modifications to the embodiments of the present disclosure. All such improvements and modifications are considered within the scope of the concepts disclosed herein and the claims that follow.

What is claimed is:

1. A semiconductor device comprising:
    a first port;
    a second port; and
    an anti-series string of varactors electrically coupled between the first port and the second port, the anti-series string of varactors comprising:
        a first varactor;
        a second varactor having an anode electrically coupled to an anode of the first varactor;
        a third varactor having a cathode electrically coupled to a cathode of the second varactor; and
        a fourth varactor having an anode electrically coupled to an anode of the third varactor wherein the first varactor and fourth varactor each has a first area and the second varactor and third varactor each has a second area, which is different than the first area.

2. The device of claim 1 wherein the second area is between 45% and 75% of the first area.

3. The device of claim 1 wherein the second area is between 50% and 60% of the first area.

4. The device of claim 1, further comprising:
   a third port;
   a first resistor electrically coupled between the third port and the anodes of the first and second varactors; and
   a second resistor electrically coupled between the third port and the anodes of the third and fourth varactors.

5. The device of claim 4, further comprising a fourth port and a third resistor electrically coupled between the fourth port and the cathodes of the second and third varactors.

6. The device of claim 1 wherein the anti-series string of varactors is formed on a substrate.

7. The device of claim 6 wherein each varactor of the anti-series string of varactors is an epitaxial stack having an upper contact layer, a varactor layer, and a lower contact layer.

8. The device of claim 1 wherein the anti-series string of varactors further comprises:
   a fifth varactor having a cathode electrically coupled to the cathode of the fourth varactor;
   a sixth varactor having an anode electrically coupled to an anode of the fifth varactor;
   a seventh varactor having a cathode electrically coupled to a cathode of the sixth varactor; and
   an eighth varactor having an anode electrically coupled to an anode of the seventh varactor wherein the fifth varactor and eighth varactor each has the first area and the sixth varactor and seventh varactor each has the second area.

9. The device of claim 1 wherein the device is coupled with one selected from a group consisting of a voltage controlled oscillator, an electronically tuned filter, and an electronically controlled switch.

10. A semiconductor device comprising:
    a first port;
    a second port, wherein neither of the first port and the second port are coupled directly to ground; and
    an anti-series string of varactors electrically coupled between the first port and the second port, the anti-series string of varactors comprising:
      a first varactor;
      a second varactor having a cathode electrically coupled to a cathode of the first varactor;
      a third varactor having an anode electrically coupled to an anode of the second varactor; and
      a fourth varactor having a cathode electrically coupled to a cathode of the third varactor wherein the first varactor and fourth varactor each has a first area and the second varactor and third varactor each has a second area, which is different than the first area.

11. The device of claim 10 wherein the second area is between 45% and 75% of the first area.

12. The device of claim 10 wherein the second area is between 50% and 60% of the first area.

13. The device of claim 10 further comprising a third port and a first resistor electrically coupled between the third port and the anodes of the second and third varactors.

14. The device of claim 13 further comprising:
    a fourth port;
    a second resistor electrically coupled between the fourth port and the cathodes of the first and second varactors; and
    a third resistor electrically coupled between the fourth port and the cathodes of the third and fourth varactors.

15. The device of claim 10 wherein the anti-series string of varactors is formed on a substrate.

16. The device of claim 15 wherein each varactor of the anti-series string of varactors is an epitaxial stack having an upper contact layer, a varactor layer, and a lower contact layer.

17. The device of claim 10 wherein the anti-series string of varactors further comprises:
    a fifth varactor having an anode electrically coupled to the anode of the fourth varactor;
    a sixth varactor having a cathode electrically coupled to a cathode of the fifth varactor;
    a seventh varactor having an anode electrically coupled to an anode of the sixth varactor; and
    an eighth varactor having a cathode electrically coupled to a cathode of the seventh varactor wherein the fifth and eighth varactors each have the first area and the sixth and seventh varactors each have the second area.

18. The device of claim 10 wherein the device is coupled with a voltage controlled oscillator, an electronically tuned filter, or an electronically controlled switch.

19. A wireless device comprising:
    an antenna;
    a radio front end (RFE) module coupled with the antenna;
    a compound varactor incorporated within or coupled with the RFE module, the compound varactor comprising:
      a first port;
      a second port, wherein neither of the first port and the second port are coupled directly to ground; and
      an anti-series string of varactors electrically coupled between the first port and the second port, the anti-series string of varactors comprising:
        a first varactor;
        a second varactor having a cathode electrically coupled to a cathode of the first varactor;
        a third varactor having an anode electrically coupled to an anode of the second varactor; and
        a fourth varactor having a cathode electrically coupled to a cathode of the third varactor wherein the first varactor and fourth varactor each has a first area and the second varactor and third varactor each has a second area which is different than the first area.

20. The device of claim 19 wherein the compound varactor is part of an impedance tuning circuit or an antenna tuning circuit.

* * * * *